(12) United States Patent
Ginetti et al.

(10) Patent No.: US 6,202,183 B1
(45) Date of Patent: Mar. 13, 2001

(54) ANALOG TEST ACCESS PORT AND METHOD THEREFOR

(75) Inventors: Bernard Ginetti, Antibes; Christian Zotier, Vidauban; Olaf Granzow, Cagnes-sur-mer, all of (FR)

(73) Assignee: Philips Semiconductors Inc., Tarrytown, NY (US)

( * ) Notice: Subject to any disclaimer, the term of this patent is extended or adjusted under 35 U.S.C. 154(b) by 0 days.

(21) Appl. No.: 09/109,848

(22) Filed: Jul. 2, 1998

(51) Int. Cl.[7] .................................................... G01R 31/28
(52) U.S. Cl. ........................ 714/726; 714/724; 324/500; 326/16
(58) Field of Search .................................. 714/726–727, 714/733, 724, 734, 731; 324/500, 537, 73.1, 158.1; 326/16; 341/120; 702/120

(56) References Cited

U.S. PATENT DOCUMENTS

| 5,404,358 | * | 4/1995 | Russell ............................... 714/727 |
| 5,535,331 | * | 7/1996 | Swoboda et al. ...................... 714/45 |
| 5,568,493 | * | 10/1996 | Morris ................................. 714/726 |
| 5,887,001 | * | 3/1999 | Russell ............................... 714/726 |

FOREIGN PATENT DOCUMENTS

0570067 A2 * 5/1993 (EP) ............................ G01R/31/318

OTHER PUBLICATIONS

Liu, et al. (Mixed Signal Testing of Analog Components on Printed Circuit Boards. IEEE, 1997).*
Lofstrom (A Demonstration IC for the P1149.4 Mixed Signal Test Standard. IEEE, 1996).*
Starzyk, et al. (An Organization of the Test Bus for Analog and Mixed-Signal Systems. IEEE, 1994).*

* cited by examiner

Primary Examiner—Albert De Cady
Assistant Examiner—Guy Lamarre (57) ABSTRACT

An improved system and method to ensure the testability of any analog cell embedded in a mixed signal IC is described wherein the testability is independent of the core logic of that IC, which does not require the dedication of any pin solely to the testing of that IC. A uniform analog test access port design simplifies chip layout, greatly reduces the number of MUXed pins required, and allows generation of an analog test program for the total chip which is a simple concatenation and re-use of the individual analog cell test programs.

20 Claims, 3 Drawing Sheets

ANALOG TEST ACCESS PORT AND METHOD THEREFOR

BACKGROUND OF THE INVENTION

1. Field of the Invention

This invention relates generally to the testing of analog circuitry and more specifically to an improved system and method for ensuring the testability of analog cells embedded in mixed signal products.

2. Description of the Prior Art

The requirements of modem electronic circuits, particularly electronic circuits typically implemented as integrated circuits (IC's) such as computer processors, signal converters, modems and control circuits, dictate the use of "mixed signal" design solutions in which one or more analog cells is "embedded" within the digital modules which make up the remainder of the chip. This remainder of the IC chip which surrounds and couples to the embedded analog cells is often called the "core logic" portion of the chip. Mixed signal implementations greatly simplify overall system design.

Mixed signal products do, however, present special testing problems in the manufacturing process. These problems arise because the complete and accurate test of an embedded analog cell requires a direct access to the inputs and outputs of the cell. This access is difficult to obtain since the analog cell is embedded, which means that all of these inputs and outputs internally interconnect to other circuit modules on the IC, and are therefore not accessible via the normal interconnection points (bonding pads) of the IC.

One prior art approach which has been used to obtain direct access to the inputs and the outputs of an embedded analog cell is to make use of multiplexed (MUXed) pads. In this method, called "MUX isolation," external pads of the IC chip are MUXed to establish either the interconnection required for the normal functioning of the IC chip, or, to an input or output of the analog cell to provide the direct access required for analog cell testability. One variation of this approach is to use "complete MUX isolation" in which MUX's are added in front of each digital input of the analog cell and also to provide access to all outputs. Although this approach provides access directly to the inputs and outputs of a given analog cell, the fact that a MUX must be added to the IC chip layout for all inputs and outputs of each of the analog cells present on the IC chip, and the fact that many analog cells are typically required to accomplish the complex internal functions of a mixed signal IC chip results in excessively large numbers of MUXed circuit pads with complex signal path routings on the IC chip. Another variation of this approach is to use "partial MUX isolation" in which MUX's are added for dynamic signals only (i.e. static configurations stored in product registers in the core logic) while direct access is provided for the analog data inputs and outputs. Disadvantages of this variation are that a long and deep test program customized for each product is required, and complete testability is not ensured.

Another problem which must be solved in connection with the testing of analog cells is to provide some kind of signal or indication that the chip is in an "analog test mode." It is highly desirable to avoid having to dedicate any pin to the test of the chip even for selecting a test mode. One solution to avoid that need would be to "program" the chip by means of several initialization test vectors, but this approach has the disadvantage that analog testing is now dependent on information, whereas the best possible condition for effective testing is that it be independent of any "knowledge" of the core logic.

It is therefore clear that the problems or disadvantages of prior solutions include: (1) they involve huge numbers of MUXed pins and routing for complex cells; (2) they require a very complex test board: (3) they require initialization vectors or dedicated pins or both to control the MUX's; and (4) they make it difficult or impossible to verify testability in the case of multiple or complex analog cells.

As a result of the above-described problems and disadvantages, there exists a need for an improved and simplified system and method which ensures the testability of the embedded analog cells of a mixed signal product which is completely independent of the core logic of that product.

OBJECTS OF THE INVENTION

Accordingly, it is an object of this invention to provide an improved system and method to ensure the testability of any analog cell embedded in a mixed signal IC.

It is a further object of this invention to provide an improved system and method to ensure the testability of any analog cell embedded in a mixed signal IC wherein the testability is completely independent of the core logic of that IC.

It is a further object of this invention to provide an improved system and method to ensure the testability of any analog cell embedded in a mixed signal IC wherein the testability is completely independent of the core logic of that IC and wherein the system and method do not require the dedication of any pin solely for the purpose of testing that IC.

It is another object of this invention to provide an improved system and method to ensure the testability of any analog cell embedded in a mixed signal IC wherein the testability is completely independent of the core logic of that IC, wherein the system and method do not require the dedication of any pin solely for the purpose of testing that IC, and wherein the system and method incorporate a simplified test access configuration to streamline the IC chip layout and reduce the number of MUXed pins required It is a further object of this invention to provide an improved system and method to ensure the testability of any analog cell embedded in a mixed signal IC wherein the testability is completely independent of the core logic of that IC, wherein the system and method do not require the dedication of any pin solely for the purpose of testing that IC, and wherein the system and method incorporate a simplified test access configuration to streamline the IC chip layout and reduce the number of MUXed pins required, and wherein the system and method allows easy generation of test programs that can be applied to each analog cell tested.

It is still a further object of this invention to provide an improved system and method to ensure the testability of any analog cell embedded in a mixed signal IC wherein the testability is completely independent of the core logic of that IC, which does not require the dedication of any pin solely for the purpose of testing that IC, wherein the system and method incorporate a simplified test access configuration to streamline the IC chip layout and reduce the number of MUXed pins required, wherein the system and method allows easy generation of test programs that can be applied to each analog cell tested, and wherein the system and method provides for the combination of these individual cell test programs to provide an overall test program which tests all analog cells present in the IC.

SUMMARY OF THE INVENTION

According to the foregoing objectives, this invention describes an improved system and method to ensure the testability of any analog cell embedded in a mixed signal IC wherein the testability is completely independent of the core logic of that IC, wherein the system and method incorporates a simplified test access configuration to streamline the IC chip layout and reduce the number of MUXed pins required, wherein the system and method allows easy generation of test programs that can be applied to each analog cell tested, and wherein the system and method provides for the combination of these individual cell test programs to provide an overall test program which tests all analog cells present in the IC.

DETAILED DESCRIPTION

Figure 1:
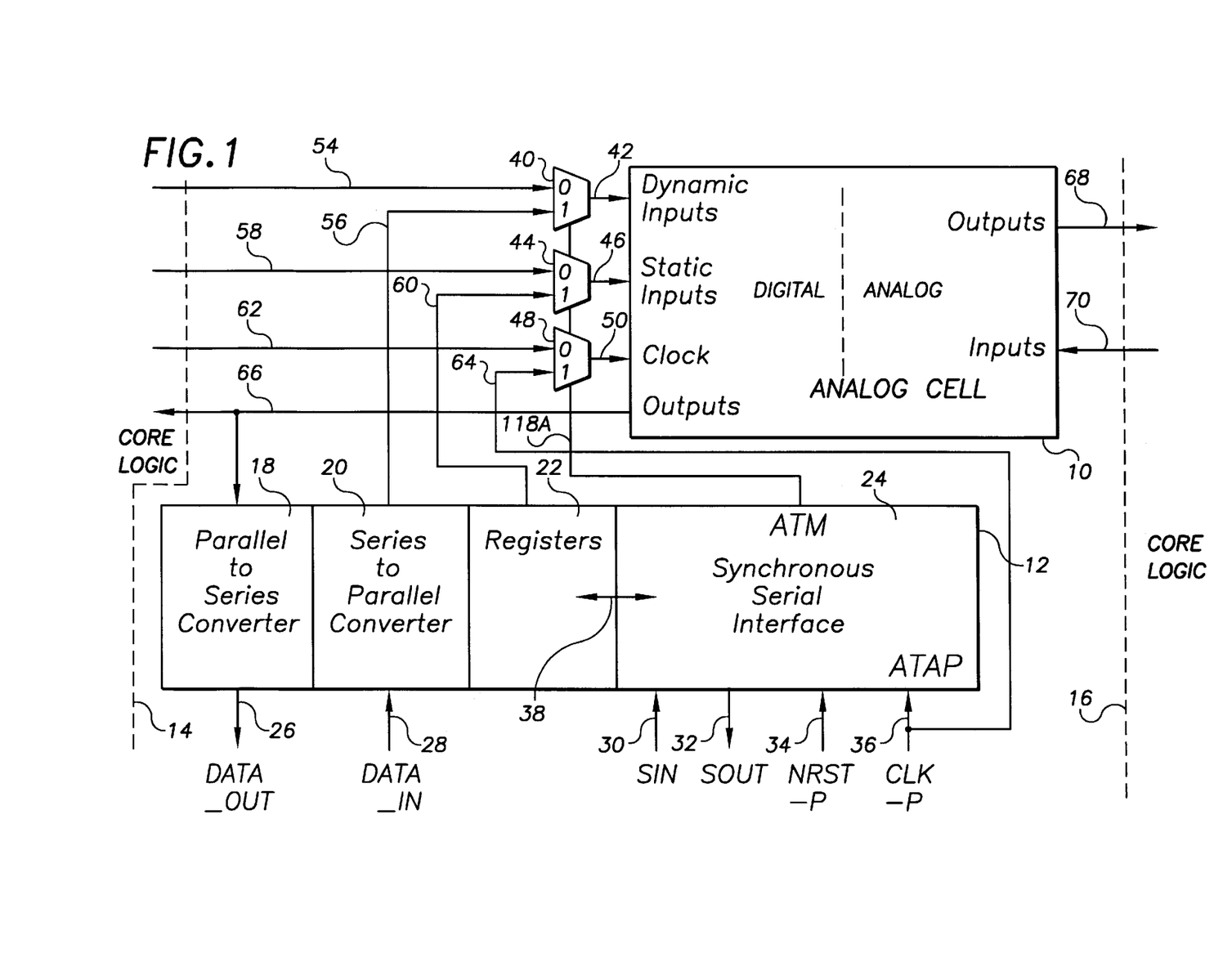
FIG. 1 is a simplified block diagram of an embedded analog cell coupled to an analog test access port (ATAP) according to the present invention.

FIG. 1 shows a simplified block diagram of an embedded analog cell coupled to an analog test access port (ATAP) according to the present invention. In this simplified block diagram, the signal paths which couple the various blocks and elements together can be either a single conduction path or a plurality of conduction paths as appropriate and as more fully described in the operation of the system described below. In FIG. 1, analog cell 10 and its associated ATAP 12 are embedded in the remaining circuitry of a mixed signal product, as represented by core logic portions 14 and 16. ATAP 12 is comprised of a parallel to series converter portion 18, a series to parallel converter portion 20, a register portion 22, and a synchronous serial interface portion 24. Parallel to series converter portion 18 couples to DATA_OUT signal path 26 and series to parallel converter portion 20 couples to DATA_IN signal path 28. Synchronous serial interface 24 couples to SIN signal path 30, SOUT signal path 32, NRSF-P signal path 34, and CLK-P signal path 36. Register portion 22 is coupled to synchronous serial interface portion 24 by a plurality of signal paths represented by the bi-directional path 38 shown in FIG. 1. FIG. 1 also shows a first input MUX 40 which couples to dynamic inputs of analog cell 10 via signal path 42, a second input MUX 44 which couples to static inputs of analog cell 10 via signal path 46, and a third input MUX 48 coupled to a clock input of analog cell 10 via signal path 50. A MUX select signal path 118A couples from the analog test mode (ATM) output of ATAP 12 to select inputs of MUX 40, MUX 44 and MUX 48. Dynamic function signal path 54 couples from core logic portion 14 to the "0" select input of MUX 40. Dynamic test signal path 56 couples from the output of series to parallel converter 20 to the "1" select input of MUX 40. Static function signal path 58 couples from core logic portion 14 to the "0" select input of MUX 44. Static test signal path 60 couples from the output of register portion 22 to the "1" select input of MUX 44. Functional clock signal path 62 couples from core logic portion 14 to the "0" select input of MUX 48. Test clock signal path 64 couples from the CLK-P input of ATAP 12 to the "1" select input of MUX 48. A first output signal path 66 couples from analog cell 10 to core logic portion 14, and also to an input of parallel to serial converter portion 18. A second output signal path 68 couples from analog cell 10 to core logic portion 16. Input signal path 70 couples from core logic portion 16 to analog cell 10.

Figure 2:
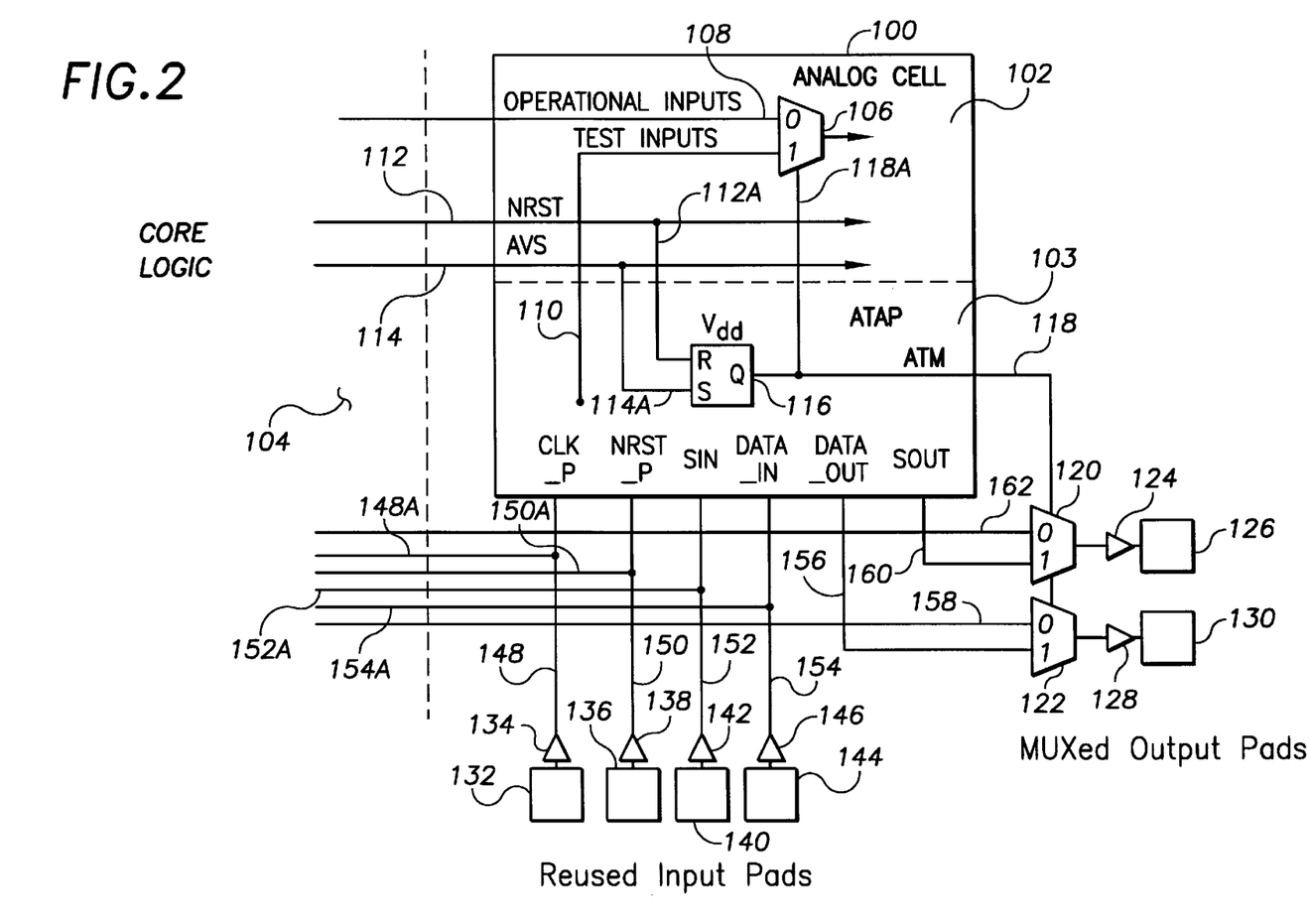
FIG. 2 is a simplified block diagram of an embedded analog cell and its associated ATAP with representative internal circuit elements and coupled signal paths according to the present invention.

FIG. 2 shows a simplified block diagram of an embedded analog cell and its associated ATAP with representative internal circuit elements and coupled signal paths according to the present invention. In FIG. 2, the block diagram previously described in FIG. 1 has been further simplified to facilitate a clearer understanding of the function of the ATAP according to the present invention. Accordingly, FIG. 2 shows a single block 100 comprising an analog cell 102 and its associated ATAP 103 as embedded in a core logic portion 104. Core logic portion 104 is coupled to the "0" select input of representative MUX 106 via representative operational inputs signal path 108. A representative test inputs signal path 110 couples from within ATAP 103 to the "1" select input of MUX 106. The NRST reset signal path 112 couples from core logic portion 104 to the reset input of test mode flip-flop 116. As indicated by the arrow shown in FIG. 2, the NRST signal path 112 also couples to a wide variety of elements witn the core logic of the mixed signal product of the present example, including all other analog cells. The analog voltage supply AVS conductor 114 couples to the set input of test mode fip-flop 116 and, as indicated by the arrow shown in FIG. 2, to all other analog cells of the mixed signal product of the present example. The Q output of flip-flop 116 couples to signal path 118 which is the ATM output of ATAP portion 103. Signal path 118 couples to a select input of output MUX 120 and to a select input of output MUX 122. The output of MUX 120 couples to the input of driver 124 whose output couples to output pad 126. The output of MUX 122 couples to the input of driver 128 whose output couples to output pad 130. Signal path 162 couples from core logic portion 104 to the "0" select input of MUX 120. The SOUT signal path 160 couples from ATAP 103 to the "1" select of MUX 120. Signal path 158 couples from core logic portion 104 to the "0" select input of MUX 122. The DATA_OUT signal path 156 couples to the "1" select input of MUX 122. Input pad 132 couples to the input of driver 134 whose output couples to the CLK_P input of ATAP portion 103 via signal path 148 and to core logic portion 104 via signal path 148A. Input pad 136 couples to the input of driver 138 whose output couples to the NRST_P input of ATAP portion 103 via signal path 150 and to core logic portion 104 via signal path 150A. Input pad 140 couples to the input of driver 142 whose output couples to the SIN input of ATAP portion 103 via signal path 152 and to core logic portion 104 via signal path 152A. Input pad 144 couples to the input of driver 146 whose output couples to the DATA_IN input of ATAP portion 103 via signal path 154 and to core logic portion 104 via signal path 154A.

Figure 3:
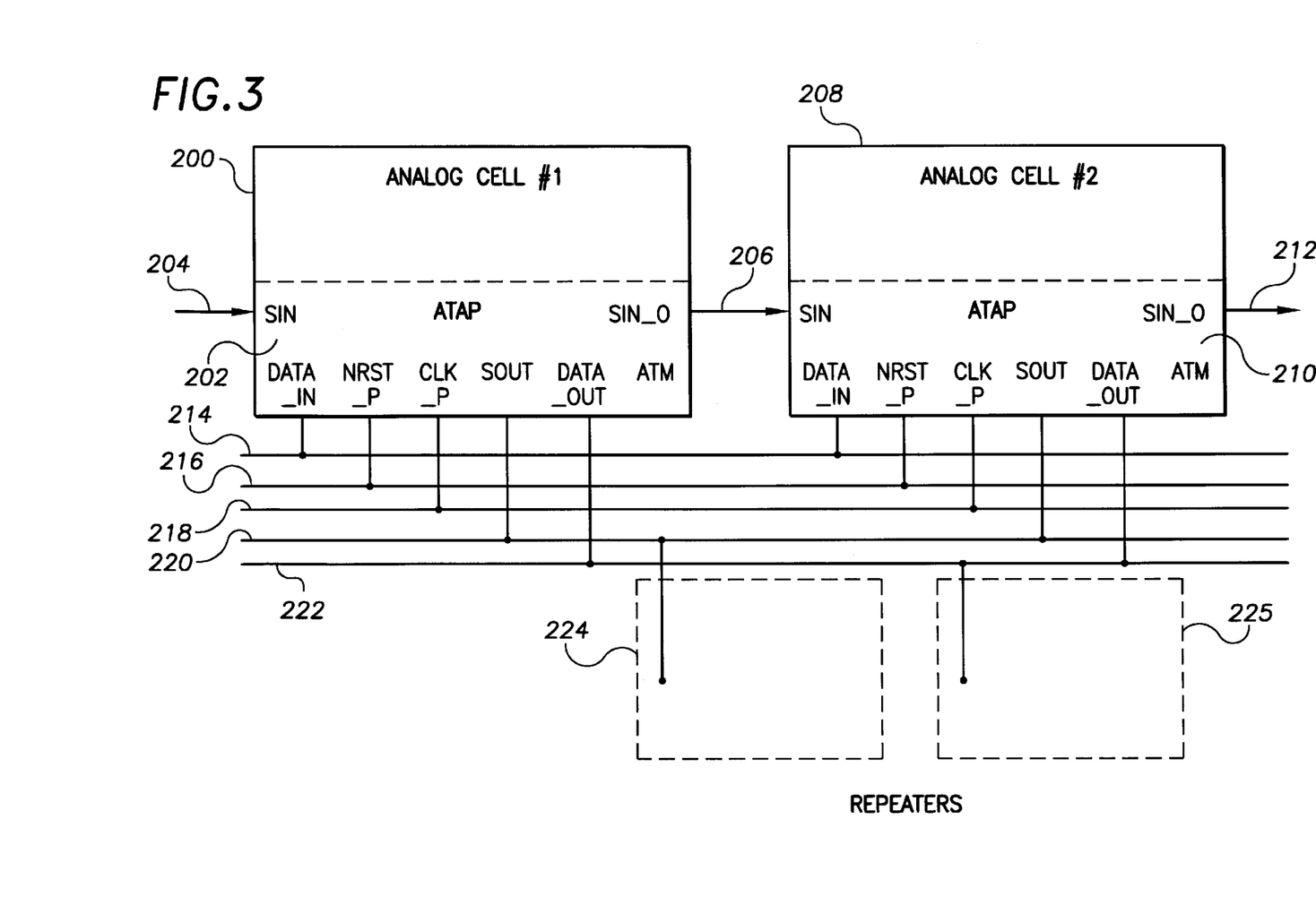
FIG. 3 is a simplified block diagram of multiple embedded analog cells with associated ATAP's with representative coupling to shared multiple signal paths according to the present invention.

FIG. 3 is a simplified block diagram of multiple embedded analog cells with associated ATAP's with representative coupling to shared multiple signal paths according to the present invention. In FIG. 3, signal path 204 couples to the SIN input of the ATAP portion 202 of first analog cell 200. The SIN_O output of ATAP portion 202 couples to signal path 206 which couples to the SIN input of ATAP portion 210 of second analog cell 208. The SIN_O output of ATAP portion 210 of second analog cell 208 couples to signal path 212. Signal path 214 couples to the DATA_IN input of first analog cell 200 and to the DATA_IN input of second analog cell 208. Signal path 216 couples to the NRST_P input of first analog cell 200 and to the NRSF_P input of second analog cell 208. Signal path 220 couples to the CLK_P input of first analog cell 200 and to the CLK_P input of second analog cell 208. Signal path 222 couples to the SOUT output of first analog cell 200 and to the SOUT output of second analog cell 208. Signal path 218 couples to the DATA_OUT output of first analog cell 200 and to the DATA_OUT output of second analog cell 208. Signal paths 214, 216, 218, 220, and 222 form an analog test data bus which couples to an external tester (not shown) via the reused input pads and MUXed output pads shown in FIG. 2. Signal path 220 and signal path 222 further couple to buss repeaters 224 and 225 which, as is well known in the art, are used with "tri-state" buses to ensure the "tri-state" buss is always driven.

The functional operation of the ATAP system according to the present invention is now described. As stated in the above discussion of the prior art, a need existed for an improved and simplified system and method which ensures the testability of the embedded analog cells of a mixed signal product which is completely independent of the core logic of that product. As shown in FIG. 1, the solution to this need provided by the present invention is to implement at the analog cell level an auxiliary port, herein defined as the analog test access port (ATAP), that provides access to all of the digital inputs and outputs while the cell is set in a dedicated "analog test mode." The digital inputs and outputs of any analog cell can be of two kinds: static or dynamic. The static signals such as power down, digitally programmed gain control, channel selection, mode selection, etc., are purely asynchronous which means they have no timing requirement. These static signals also have low data rates and are often highly numerous even for simple cells. Thus, these signals are advantageously exchanged on a serial interface and stored locally into registers to greatly reduce the number of interconnections that would otherwise be required. The dynamic signals or data such as the code streams for an analog to digital converter (ADC) cell or a digital to analog converter (DAC) cell are usually a smaller number of signal paths (8 bit or 16 bit) so they can usually be accommodated by serial conmunication. It should be noted that in many cases, the analog cell itself is using or generating the data in a serial mode (typical examples are Successive Approximation ADC or sigma-delta converters), which further justifies the use of a serial link.

Thus, as shown in FIG. 1, the basic ATAP consists of a ful duplex 2-channel (static/dynamic) synchronous serial interface, with the following 6 signal paths for inputs and outputs:

(1) CLK_P (signal path 36)—the clock input for both the analog cell and the synchronous serial communication;
(2) NRST-P (signal path 34)—the master reset input;
(3) SIN (signal path 30)—the serial input for static signals (e.g. power downs, channel selects, etc.);
(4) SOUT (signal path 32)—the serial output for static signals (e.g. register read-back);
(5) DATA-IN (signal path 28)—the serial input for data (e.g. DAC input codes); and
(6) DATA-OUT (signal path 26)—the serial output for data (e.g. ADC output codes).

For cells requiring very high data rates (e.g. video ADC's or DAC's) that cannot be accommodated by a serial interface due to product or tester limitations, the number of DATA-IN and DATA-OUT signal paths can be increased accordingly. Also, both low data rate and high data rate cells can be simultaneously present on an IC chip as is described below.

Turning now to FIG. 2, the ATAP of the present invention is described in terms of its operation and advantages at the IC chip level. As shown, interface to the internal ATAP requires only 6 pads. These are the four input pads 132, 136, 140, and 144 which couple respectively to the CLK-P, NRST-P, SIN and DATA_IN inputs of the ATAP and are shared with any other input signals to the chip. As for the two outputs, output signal SOUT can be MUXed with any other output signal via 120 to couple to output pad 126, and output signal DATA_OUT can be MUXed with any other output signal via 122 to couple to output pad 130. As previously stated, an object of the present invention is to ensure the testability of any analog cell embedded in a mixed signal IC which is completely independent of the core logic of that IC. As is shown in the particular embodiment of FIG. 1, this objective is accomplished at the cell level through the use of ATAP 12 to consolidate and unify the inputs and outputs required for independent testing of analog cell 10 and by the use of 40, 44 and 48 to completely isolate the test inputs from the core logic (core logic portion 14). As is shown in FIG. 2, this objective is accomplished at the IC chip level through the implementation of the reused input pads 132, 136, 140, and 144, and the use of 120 and 122 to obtain isolation of output pad 126 and output pad 130.

A further object of the present invention is to ensure the testability of any analog cell embedded in a mixed signal IC that does not require the dedication of any pin solely for testing of that IC. Referring to FIG. 2, this object is accomplished by a mode memory element which is used to generate the analog test mode for the IC chip. The analog test mode defines whether the mixed signal IC chip to which the present invention pertains is to function in its normal operating mode or in its analog test mode in which all of the IC chip's embedded analog cells are made available for test. As shown in FIG. 2, the analog test mode is defined by the logical state of set-reset mode flip flop 116. When mode flip flop 116 is set, the Q output of the mode flip flop 116 couples a logic "1" level on analog test mode (ATM) signal path 118 and 118A to establish the signal path conditions required for testing of the analog cell, which is totally independent of the core logic in which the cell is embedded. When mode flip flop 116 is reset, the Q output of the mode flip flop 116 couples a logic "0" level on analog test mode (ATM) signal path 118 and 118A to establish the signal path conditions which allow the embedded analog cell to resume its normal operating function where the analog cell is controlled by the core logic.

A key feature of the present invention which allows testability of the embedded analog cell without the use of any extra pin solely dedicated to testing of the IC chip resides in the way in which mode flip flop 116 is set and reset. In order to understand the operation of mode flip flop 116, it must first be noted that all mixed signal designs make use of a negative analog voltage supply for circuitry within the analog cell and that this supply is independent of the digital power supplies which are used throughout the IC chip. It further must be noted that all mixed signal designs also make use of a "main reset" signal which is used throughout both the analog cells and the core logic. In FIG. 2, the analog voltage supply (AVS) conductor 114 couples from the negative analog voltage supply module (not shown) to all of the ATAP's associated with all of the analog cells of the IC chip and, in particular, to AVS conductor 114A which couples to the set input of mode flip flop 116 which is powered by the digital power supplies (not shown) which produce supply voltages Vdd and Vss. Pulsing a high level on the negative analog power supply output has the effect of coupling a logic "1" to the set input of mode flip flop 116 to establish the analog test mode for ATAP 103 and, in similar fashion, for all other ATAP's associated with all other analog cells of the IC chip. As also shown in FIG. 2, NRST signal path 112 couples from the main reset module (not shown) both to the analog cells and to the core logic of the IC chip and, in particular, to signal path 112A which couples to the reset input of mode flip flop 116. A logic "1" on NRST signal path 112 and signal path 112A resets mode flip flop 116 to establish the normal operating mode for ATAP 103 and, in similar fashion, for all other ATAP's associated with all other analog cells of the IC chip. Once the analog test mode is enabled, analog cell 10 digital inputs are MUXed to ATAP signals via MUX registers (40, 44 and 48 in FIG. 1) and the outputs are MUXed to ATAP outputs (MUX 120 coupled to pad 126 and MUX 122 coupled to pad 130 in FIG. 2). For clarity regarding FIG. 2, it should be noted that representative MUX 106 which has signal path 108 coupled to its "0" select input, signal path 110 coupled to its "1" select input and signal path 118A coupled to its select input, is included to symbolize the functions of MUX 40, MUX 44 and MUX 48 in FIG. 1 with respect to the analog test mode. Thus the ability of the present invention to ensure testability of the embedded analog cell without the use of any extra pin solely dedicated for testing of the IC chip has been demonstrated.

A further object of the present invention is to provide a system and method which allows easy generation of test programs which can be applied to each analog cell tested and which provides for the combination of these individual cell test programs to provide an overall test program which tests all analog cells present on the IC chip. In order to access all of the embedded analog cells in a mixed signal design by use of a single set of ATAP pads as shown in FIG. 2, a communication protocol is required. To implement this protocol in the present invention, each of the ATAP's associated with each of the analog cells includes an SIN_O output which provides means for interconnecting to the ATAP of another analog cell so that all of the cells of the IC chip can be interconnected together ("chained"). FIG. 3 shows two analog cells with their associated ATAP imputs and outputs which are representative of the interconnected analog cells on an IC chip. In FIG. 3, signal path 204 couples from some prior cell to the SIN input of the ATAP 202 associated with first analog cell 200. ATAP 202 has a SIN_O output which couples via signal path 206 to the SIN input of the ATAP 210 associated with second analog cell 208. ATAP 210 has a SIN_O output which couples via signal path 212 to the next ATAP (and analog cell) in the "chain". FIG. 3 also shows how the inputs and outputs for each ATAP (DATA_IN, NRST_P, CLK_P, SOUT and DATA_OUT) are transmitted by a signal path "bus" (signal paths 214, 216, 218, 220 and 222, respectively) to each of the analog cells in the chain. The communication protocol is based on the following three states:

STATE 0 ("cell awaiting test")—The ATAP outputs DATA_OUT and SOUT are in the high impedance state. Repeaters 224 and 225 (discussed below) are used to maintain logic levels. The serial output SIN_O is set to logic "0".

STATE 1 ("cell under test")—The ATAP outputs DATA_OUT and SOUT are in the low impedance state. The serial output SIN_O is set to logic "0".

STATE 2 ("cell tested")—The ATAP outputs DATA_OUT and SOUT are in the high impedance state. The serial output SIN_O is MUXed to its serial input SIN so that the cell acts as a pass-through repeater.

Repeaters 224 and 225 are required to maintain the logic level because SOUT bus 220 and DATA_OUT bus 222 are "tri-state" buses. The repeaters 224 and 225, latch the logic state of the tri-state buses when they are not driven to prevent the logic level from decaying. This technique is well known to those skilled in the art whenever a "tri-state" bus is either not driven, or it may possibly be left in an unknown state.

When the analog test mode is established by a positive pulse on the AVS conductor (previously discussed for FIG. 2), all ATAPs are in STATE 0. Changing from STATE 0 to STATE 1 and from STATE 1 to STATE 2 is achieved in a given ATAP when that ATAP receives a "key message". Thus if, for example, there are N analog cells (each with its associated ATAP) to be tested, the operating sequence is as follows: When the analog test mode is established, only the first ATAP of the chain is receiving messages. Upon receipt of a first key message, the first ATAP changes from STATE 0 to STATE 1. The testing of the first analog cell is initiated and its ATAP takes control of the tri-state output bus. After the testing of the first analog cell is complete, a second key message is sent changing the first ATAP from STATE 1 to STATE 2 so that the first ATAP becomes a pass-through repeater, and all subsequent key messages are passed on to the second ATAP, but are ignored by the first ATAP. Then, the third key message passes through the first ATAP to the second ATAP, causing it to change from STATE 0 to STATE 1, so that testing of the second analog cell can begin. This operating sequence continues for all of the N ATAPs in the chain with each successive ATAP being switched from its initial STATE 0 to STATE 1, remaining in STATE 1 while its analog cell is being tested, and then being switched to STATE 2 to act as a pass through. All state changes are in response to the key messages used for all ATAP cells. Because of the action of the chain of ATAP's as passive repeaters which are totally independent of the core logic and the individual cells being tested, the complete analog test program for a particular mixed signal product can be obtained simply by concatenating the test programs of the individual analog cells present on the IC chip, separated by the appropriate key messages. The advantage of such a solution is that it allows any number of analog cells to be present on the IC chip, and the only requirement is that they are "chained" together and that they all use the same ATAP structure. There is no need for a dedicated "test access port" controller or for any logic that would depend either upon the analog cells or upon the core logic. Also, there is no interference between the test of each cell nor any need to change or re-compile their respective test programs. This allows the automatic generation of the complete analog test program for all of the analog cells of the IC chip—a procedure called "automatic test analog patterns generation" (ATAPG).

In summary, in view of the above descriptions, the present invention is seen to include at least the following unique and distinct advantages:

(1) The present invention ensures the testability of the analog portion of any mixed signal product provided that the ATAP is correctly connected (since each ATAP correction is the same for all cells, this could be automatically checked or screened). All analog cells used on the mixed signal product can be accessed for test regardless of the number of cells or their design complexity.

(2) The test of the embedded analog cells is totally independent of the core logic of the nixed signal IC chip. The access to the analog cells is not going through the core logic and there is no need for any initialization vectors. The test program for a particular type of analog cell need only be developed once—it can be reused for all applications of this type of analog cell without change. This further allows automatic generation of an analog test program for the mixed signal product which is a simple concatenation of the test programs of the individual cells separated by key messages which steer each individual analog cell test sequence to the appropriate analog cell.

(3) There is no need for a dedicated test pin and the number of MUXed pins is greatly reduced as compared to prior art solutions. The use of a standard ATAP structure which uses a minimum of input and output signal paths results in routing at the chip level which is simple and requires a small part of the IC's chip area. Also, the use of minimal ATAP I/O pins results in a test board which is simple and which can be used by a very simple tester with very few analog-dedicated digital pins.

(4) The solution is generic since it applies to any mixed signal product with any number of analog cells, regardless of whether they are identical or different. The solution is easily implemented as modules since the interconnection scheme is systematic and there is no need for any port controller which depends upon the number of analog cells.

While the invention has been particularly shown and described with reference to a preferred embodiment thereof, it will be understood by those skilled in the art that changes in form and detail may be made therein without departing from the spirit arid the scope of the invention.

What is claimed is:

1. A system for testing N analog cells embedded within a mixed signal product comprising, in combination:

N ATAP means switchably coupled one for one to said N analog cells for applying analog tests;

bus means coupled in common to said N ATAP means for transmitting and receiving analog test data; and series coupling means for coupling said N ATAP means in a series chain;

each of said N ATAP means further comprising memory means for defining a STATE 0 ("cell awaiting test"), a STATE 1 ("cell under test") and STATE 2 ("cell tested");

key message means for transmitting key messages with respect to said memory means over said series coupling means;

said analog tests being supplied to each one of said N analog cells in a sequence corresponding to said series chain in response to key messages transmitted over said series coupling means; and each of said N ATAP means sequentially switching to said STATE 2 to become a passive repeater of said key messages after analog testing of the corresponding analog cell is completed.

2. The system for testing N analog cells embedded within a mixed signal product according to claim 1, said memory means further comprising test mode flip flop means to cause a logic level to be established on a ATM signal path to define an analog test mode for said mixed signal product, and said test mode flip flop means to cause a logic level to be established on said ATM signal path to define a normal operating mode for said mixed signal product.

3. The system for testing N analog cells embedded within a mixed signal product according to claim 2, further comprising a negative analog power supply conductor coupled to said N analog cells for normal system operation and coupling to a set input of each said test mode flip flop means in each ATAP means, said key message means including an external tester that initiates a positive pulse on said negative analog power supply conductor that establishes a logic "1" on said ATM signal path.

4. The system for testing N analog cells embedded within a mixed signal product according to claim 3, further comprising a master reset signal path coupled to a core logic of said mixed signal product and coupled to said reset input of each said test mode flip flop means in each ATAP means so that a logic "1" pulse on said master reset signal path establishes a logic "0" on said ATM signal path.

5. The system for testing N analog cells embedded within a mixed signal product according to claim 4, further comprising input MUX means having MUX select inputs coupled to said ATM signal path, "0" select inputs coupled to said core logic, "1" select inputs coupled to at least one of said N ATAP means, and MUX outputs coupled to said analog cell for transmitting test signals in said analog test mode and transmitting operational signals in said normal operating mode.

6. The system for testing N analog cells embedded within a mixed signal product according to claim 5, further comprising output MUX means having MUX select inputs coupled to said ATM signal path, "0" select inputs coupled to said core logic, "1" select inputs coupled to at least one of said N ATAP means, and MUX outputs coupled to output pins of said mixed signal product for transmitting test signals in said analog test mode and transmitting operational signals in said normal operating mode.

7. The system for testing N analog cells embedded within a mixed signal product according to claim 6, said mixed signal product comprising an integrated circuit having input pins, output pins, and power supply pins all of which are utilized in normal operation of said mixed signal product, said system providing test access to all of said N analog cells such that said N analog cells are completely isolated from said core logic and such that no pin dedicated solely to analog test is required.

8. The system for testing N analog cells embedded within a mixed signal product according to claim 7, said external tester further comprising an analog test program for said mixed signal product which is formed by a concatenation of the analog tests for each of said N analog cells separated by key messages sent by said external tester.

9. A system for testing analog cells embedded within a mixed signal IC comprising, in combination:
    a plurality of input MUX, each one of said input MUX having an output coupled to one of said analog cells, having a "0" select input coupled to core logic of said mixed signal IC, having a "1" select input, and having an input MUX select input;
    a plurality of ATAPs, each one having an output coupled to a corresponding "1" select input of a corresponding input MUX, and each ATAP being coupled in common to an analog test bus which also couples to an external tester;
    at least one output MUX wherein each output MUX has an output coupled to a pin of said mixed signal IC, a "0" select input coupled to said core logic, a "1" select input, and an output MUX select input;
    each ATAP of said plurality of ATAPs further including a mode memory, a serial data input, and a serial data output;
    said mode memory having a set input coupled to a negative analog power supply conductor of said mixed signal IC, having a reset input coupled to a master reset signal path of said mixed signal IC, and having an ATM output coupled to said input MUX select input and to said output MUX select input;
    said plurality of ATAPs having a chained serial data connection formed by coupling said serial data input of a first ATAP to said analog test bus, coupling said serial data output of said first ATAP to said serial data input of a second ATAP, coupling said serial data output of said second ATAP to said serial data input of a third ATAP, and repeating this interconnection sequence until said chained serial data connection couples all of said plurality of ATAPs;
    said external tester initiating a positive pulse on said negative analog power supply conductor to set the mode memory of each of said plurality of ATAP's and thereby establish logic "1" level on the ATM output of each ATAP so that said plurality of input MUX and said at least one output MUX are in a "1" select state and state logic for each ATAP is in STATE 0 ("cell awaiting test");
    said external tester sending a first key message on said serial data input of said first ATAP to change said state logic of said first ATAP to a STATE 1 ("cell under test") and transmitting and receiving data on said analog test bus to test a first analog cell;
    said external tester sending a second key message on said serial data input of said first ATAP to change said state logic of said first ATAP to a STATE 2 ("cell tested") state wherein said first ATAP becomes a passive repeater transmitting serial data from the serial data input to the serial data output to initiate said chained serial data connection; and
    said external tester providing a series of analog test sequences separated by appropriate key messages to sequentially test all of said analog cells embedded within said mixed signal IC.

10. The system for testing analog cells embedded within a mixed signal IC according to claim 9, said plurality of input MUX and said at least one output MUX completely isolating said core logic so that all analog testing is independent of said core logic.

11. The system for testing analog cells embedded within a mixed signal IC according to claim 10, said mode memory having said set input coupled to the negative analog power supply conductor of said mixed signal IC, having said reset input coupled to the master reset signal path of said mixed signal IC, and having said at least one output MUX having an output coupled to a pin of said mixed signal IC to allow said testing of said analog cells to occur without use of any IC pins dedicated only to analog testing.

12. The system for testing analog cells embedded within a mixed signal IC according to claim 11, said external tester further comprising an analog test program for said mixed signal IC which is formed by a concatenation of analog tests for each of the individual analog cells separated by key messages.

13. A method for testing N analog cells embedded within a mixed signal product comprising the steps of:
    providing N ATAP means switchably coupled one for one to said N analog cells for applying analog tests;
    providing bus means coupled in common to said N ATAP means for transmitting and receiving analog test data; and
    providing series coupling means for coupling said N ATAP means in a series chain;
    each of said N ATAP means further comprising memory means for defining a STATE 0 ("cell awaiting test"), a STATE 1 ("cell under test") and STATE 2 ("cell tested");
    transmitting key messages with respect to said memory means over said series coupling means;

said analog tests being supplied to each one of said N analog cells in a sequence corresponding to said series chain in response to key messages transmitted over said series coupling means; and each of said N ATAP means sequentially switching to said STATE 2 to become a passive repeater of said key message means after analog testing of the corresponding analog cell is completed.

14. The method for testing N analog cells embedded within a mixed signal product according to claim 13, said memory means further comprising test mode flip flop means having a set input, a reset input, and an output coupled to an ATM signal path, said test mode flip flop means responding to a logic "1" pulse on said set input to cause a logic "1" level to be established on said ATM signal path to define an analog test mode for said mixed signal product, and said test mode flip flop means responding to a logic "1" pulse on said reset input to cause a logic "0" level to be established on said ATM signal path to define a normal operating mode for said mixed signal product.

15. The method for testing N analog cells embedded within a mixed signal product according to claim 14 further comprising a negative analog power supply conductor coupled to said N analog cells for normal system operation and coupling to said set input of each test mode flip flop means in each ATAP means so that a positive pulse on said negative analog power supply conductor establishes a logic "1" on said ATM signal path.

16. The method for testing N analog cells embedded within a mixed signal product according to claim 15, further comprising a master reset signal path coupled to a core logic of said mixed signal product and coupled to said reset input of each said test mode flip flop means in each ATAP means so that a logic "1" pulse on said master reset signal path establishes a logic "0" on said ATM signal path.

17. The method for testing N analog cells embedded within a mixed signal product according to claim 16, further comprising input MUX means having MUX select inputs coupled to said ATM signal path, "0" select inputs coupled to said core logic, "1" select inputs coupled to at least one of said N ATAP means, and MUX outputs coupled to said analog cell for transmitting test signals in said analog test mode and transmitting operational signals in said normal operating mode.

18. The method for testing N analog cells embedded within a mixed signal product according to claim 17, further comprising output MUX means having MUX select inputs coupled to said ATM signal path, "0" select inputs coupled to said core logic, "1" select inputs coupled to at least one of said N ATAP means, and MUX outputs coupled to output pins of said mixed signal product for transmitting test signals in said analog test mode and transmitting operational signals in said normal operating mode.

19. The method for testing N analog cells embedded within a mixed signal product according to claim 18, said mixed signal product comprising an integrated circuit having input pins, output pins, and power supply pins all of which are utilized in normal operation of said mixed signal product, said system providing test access to all of said N analog cells such that said N analog cells arc completely isolated from said core logic and such that no pin dedicated solely to analog test is required.

20. The method for testing N analog cells embedded within a mixed signal product according to claim 19, said external tester further comprising an analog test program for said mixed signal product which is formed by a concatenation of the analog tests for each of said N analog cells separated by said key message means.

* * * * *